United States Patent
Sakata et al.

(10) Patent No.: US 10,425,081 B2
(45) Date of Patent: Sep. 24, 2019

(54) FIELD PROGRAMMABLE LOGIC ARRAY

(71) Applicant: Hitachi, Ltd., Chiyoda-ku, Tokyo (JP)

(72) Inventors: Teruaki Sakata, Tokyo (JP); Tsutomu Yamada, Tokyo (JP); Teppei Hirotsu, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 172 days.

(21) Appl. No.: 15/546,694

(22) PCT Filed: Jan. 28, 2015

(86) PCT No.: PCT/JP2015/052258
§ 371 (c)(1),
(2) Date: Jul. 27, 2017

(87) PCT Pub. No.: WO2016/121015
PCT Pub. Date: Aug. 4, 2016

(65) Prior Publication Data
US 2018/0278254 A1 Sep. 27, 2018

(51) Int. Cl.
*G06F 11/00* (2006.01)
*H03K 19/177* (2006.01)
(Continued)

(52) U.S. Cl.
CPC . *H03K 19/17764* (2013.01); *G01R 31/31703* (2013.01); *G01R 31/318519* (2013.01);
(Continued)

(58) Field of Classification Search
CPC ....... H03K 19/17764; H03K 19/17732; G01R 31/31703; G01R 31/318519; G06F 11/10;
(Continued)

(56) References Cited

U.S. PATENT DOCUMENTS 4,780,628 A * 10/1988 Illman ............ G01R 31/318516
326/16
6,530,049 B1 3/2003 Abramovici et al.
(Continued)

FOREIGN PATENT DOCUMENTS

JP 2002-50957 A 2/2002
JP 2007-58419 A 3/2007
(Continued)

OTHER PUBLICATIONS

International Search Report (PCT/ISA/210) issued in PCT Application No. PCT/JP2015/052258 dated Apr. 7, 2015 with English translation (3 pages).
(Continued)

*Primary Examiner* — Albert Decady
*Assistant Examiner* — Osman M Alshack
(74) *Attorney, Agent, or Firm* — Crowell & Moring LLP

(57) ABSTRACT

To realize control of a system for which a high level of safety is demanded by one SRAM-type FPGA, it is to eliminate a possibility that an undesirable control signal is output to the outside of the FPGA because of influence of failure by a soft error and the like and a problem. To solve this problem, there is provided a hard macro having fixed circuitry structure, programmable logic arranged via an interval close to the hard macro and having a changeable circuitry structure, and an I/F circuit which is provided inside the programmable logic and outputs a processing result in the programmable logic to the hard macro. It is a characteristic that the I/F circuit monitors soundness of the programmable logic and stops output of the processing result to be transmitted to the hard macro on the basis of a monitoring result.

11 Claims, 12 Drawing Sheets

(51) Int. Cl.
*G01R 31/3185* (2006.01)
*G01R 31/317* (2006.01)
*G06F 11/10* (2006.01)
*G11C 29/52* (2006.01)
*G11C 29/12* (2006.01)
*G11C 29/04* (2006.01)

(52) U.S. Cl.
CPC .......... *G06F 11/10* (2013.01); *G06F 11/1004* (2013.01); *G06F 11/1068* (2013.01); *G11C 29/12* (2013.01); *G11C 29/52* (2013.01); *H03K 19/17732* (2013.01); *G11C 2029/0409* (2013.01)

(58) Field of Classification Search
CPC ............. G06F 11/1004; G06F 11/1068; G06F 17/5027; G06F 17/5054; G06F 21/76; G11C 29/12; G11C 29/52; G11C 2029/0409
USPC ................. 714/718, 746, 758, 759, 763, 764
See application file for complete search history.

(56) References Cited

U.S. PATENT DOCUMENTS

| | | | | |
|---|---|---|---|---|
| 6,744,274 B1* | 6/2004 | Arnold | ............. | G01R 31/31724 326/16 |
| 7,036,059 B1* | 4/2006 | Carmichael | ......... | G06F 11/1004 714/725 |
| 7,573,295 B1* | 8/2009 | Stadler | ............ | H03K 19/17732 326/38 |
| 2006/0117234 A1* | 6/2006 | Miyake | ............ | H03K 19/17764 714/725 |
| 2007/0050689 A1 | 3/2007 | Sasakura | | |
| 2009/0013219 A1 | 1/2009 | Kitaoka et al. | | |
| 2009/0160483 A1* | 6/2009 | Verma | .................. | H03K 19/177 326/41 |
| 2010/0190519 A1* | 7/2010 | Zavadsky | ........... | H04W 52/343 455/522 |
| 2011/0209021 A1* | 8/2011 | Sorensen | ................ | A61B 7/00 714/733 |

FOREIGN PATENT DOCUMENTS

| | | |
|---|---|---|
| JP | 2007-243671 A | 9/2007 |
| JP | 2009-17010 A | 1/2009 |
| JP | 2012-99760 A | 5/2012 |

OTHER PUBLICATIONS

Japanese-language Written Opinion (PCT/ISA/237) issued in PCT Application No. PCT/JP2015/052258 dated Apr. 7, 2015 (3 pages).
Hallett, "Isolation Design Flow for Xilinx 7 Series FPGAs or Zynq-7000 AP SoCs (ISE Tools)", Xilinx XAPP1086 (v1.3.1), Feb. 5, 2015, pp. 1-57.
English translation of Japanese Office Action issued in counterpart Japanese Application No. 2016-571564 dated Mar. 27, 2018 (two pages).

* cited by examiner

FIELD PROGRAMMABLE LOGIC ARRAY

TECHNICAL FIELD

The present invention relates to a field programmable logic array.

BACKGROUND ART

In a control system for which very high reliability is demanded so as to ensure safety of a human life and environment for a plant, a railroad, an automobile, an airplane and the like, in case failure and abnormality should occur in the system, measures for preventing the system from running out of control and running into a dangerous situation are required to be taken.

Therefore, for a controller that controls inside such a system, reliability and safety are required to be enhanced.

For such a controller, an ASIC (Application Specific Integrated Circuit) has been principally used.

However, recently, it has been difficult to newly develop ASIC for an industrial control system having a small number of production units because of the rise of manufacturing costs according to refinement in a semiconductor process.

In the meantime, as to a Field Programmable Logic Array (hereinafter called FPGA) put in practical application in the 1980s, since a degree of integration and performance are enhanced because of refinement and the price is also settled down, case where FPGA is used for an industrial control system having few production units is seen.

Incidentally, it is an SRAM (Static Random Access Memory) type that is principally used for recent FPGA.

The SRAM-type FPGA has a characteristic that it can realize an arbitrary logical circuit by changing a value to be written to a LUT Look Up Table) configured by SRAM when power is turned on.

However, when temporary failure called a soft error that a bit of SRAM temporarily changes occurs due to this characteristic by influence of noise from the outside, cosmic rays radiated in the air and the like, the configuration is turned into a configuration different from a desired circuit, consequently, a malfunction of a system is caused, and a case where a system is shut down may occur.

Accordingly, to use the SRAM-type FPGA especially for industry, failure is required to be detected in a circuit inside the FPGA and when the situation is judged as failure, a mechanism for transferring the FPGA to a safe state is required to be securely fabricated.

From such a background, technique for enhancing safety of the SRAM-type FPGA which is said to easily cause a soft error, compared with ASIC in which circuitry configuration is fixed is proposed.

For example, in Patent Literature 1, an example that resistance when FPGA fails is enhanced utilizing incremental resetting in operation is described.

In addition, in Nonpatent Literature 1, an example that an internal region of FPGA is divided into blocks and the blocks are packaged for each function is described.

CITATION LIST

Patent Literature

Patent literature 1: Japanese Unexamined Patent Application Publication No. 2002-50957

Nonpatent Literature

Nonpatent literature 1: Xilinx XAPP1086 (v1.1)

SUMMARY OF INVENTION

Technical Problem

Incidentally, as a result of examination by these inventors as to the related techniques for enhancing safety of FPGA, the followings have been clarified.

The example in Patent Literature 1 has had a problem that since an area with failure and an operated area are not physically separated though parts in which failure is detected in operation of the SRAM-type FPGA separate inside the FPGA, unexpected data is carelessly transmitted to the operated area from the area with the failure, and it cannot be guaranteed whether normal operation as the system can be maintained.

In addition, the example in Nonpatent Literature 1 has had a problem that since the physically divided areas are also configured by SRAM and ports of each block can be arbitrarily wired though the blocks divided for each function in the SRAM-type FPGA are physically separated, unexpected data from the area with failure may still be transmitted to another area separated beforehand.

Then, the present invention aims to provide a configuration that an undesirable value is not output to the outside of FPGA even if programmable logic (hereinafter called PL) configured by SRAM fails when the SRAM-type FPGA is used for the system focused on safety, and provide a mechanism for enabling maintaining safety of a system.

Solution to Problem

To settle the abovementioned problem, configurations disclosed in the claims for example are adopted.

This application includes plural means for settling the problem. However, to take up an example, the present invention is provided with a hard macro having a fixed circuitry structure, programmable logic arranged via an interval close to the hard macro and having a changeable circuitry structure and an I/F circuit which is provided in the programmable logic and outputs a processing result in the programmable logic to the hard macro, and wherein the I/F circuit monitors soundness of the programmable logic and stops output of the processing result to be transmitted to the hard macro on the basis of a result of the monitoring.

Advantageous Effects of Invention

According to the present invention, in a case where a system for which a high level of safety is demanded is realized using one SRAM-type FPGA including the hard macro, the system can be made to proceed into a safe state before influence of failure is transmitted to external equipment even if the FPGA fails.

Problems, configurations and effect except for the abovementioned ones will be clarified by description of the following embodiments.

DESCRIPTION OF EMBODIMENTS

Figure 1:
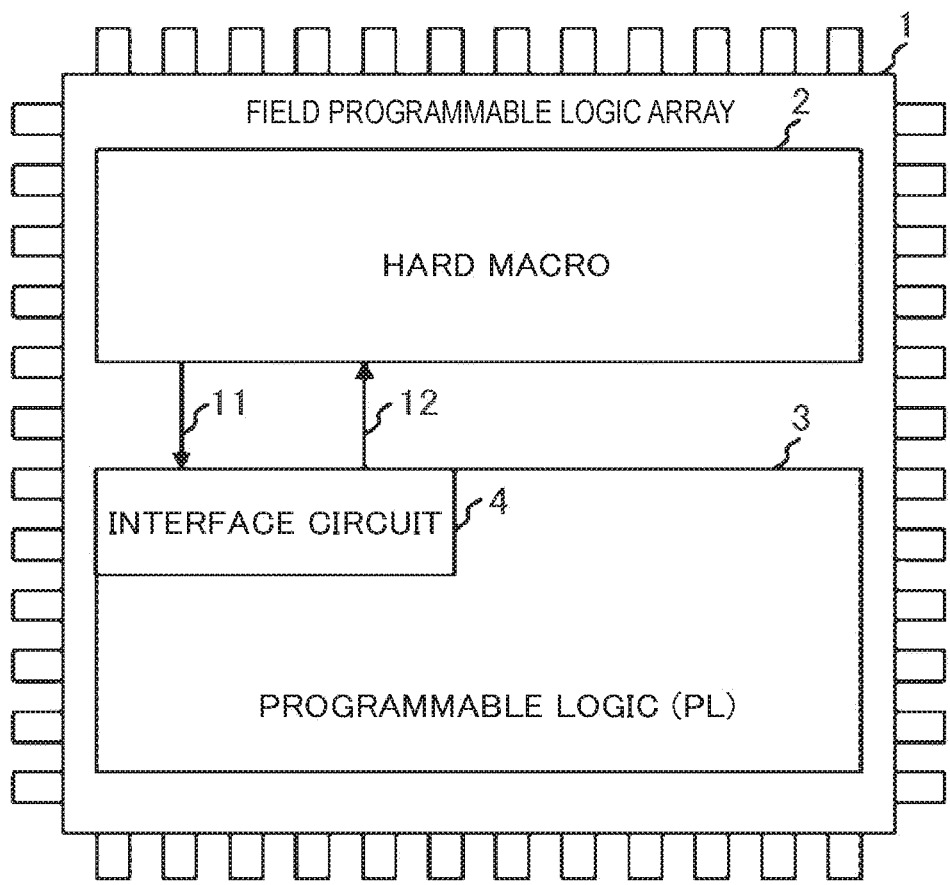
FIG. 1 shows one example of a general view showing a field programmable logic array according to the present invention in a first embodiment.

Referring to the drawings, embodiments of the present invention will be described below.

First Embodiment

FIG. 1 shows one example of a general view showing FPGA according to the present invention.

The FPGA (1) has the following configuration. A hard macro 2 the circuitry configuration of which is fixed and the function of which cannot be changed and a programmable logic (PL) 3 the circuitry configuration of which can be changed when power is turned on and in operation are built in the FPGA, an interface circuit 4 is built in the PL (3), the hard macro 2 outputs a PL diagnosis control signal 11 to the interface circuit 4, and the interface circuit 4 outputs a PL data signal 12 acquired by hardware operation process of the PL (3) to the hard macro 2. The hard macro 2 and the PL (3) are packaged with an area between them, and only the PL diagnosis control signal 11 and the PL data signal 12 are communicated between the hard macro and the PL.

Figure 2:
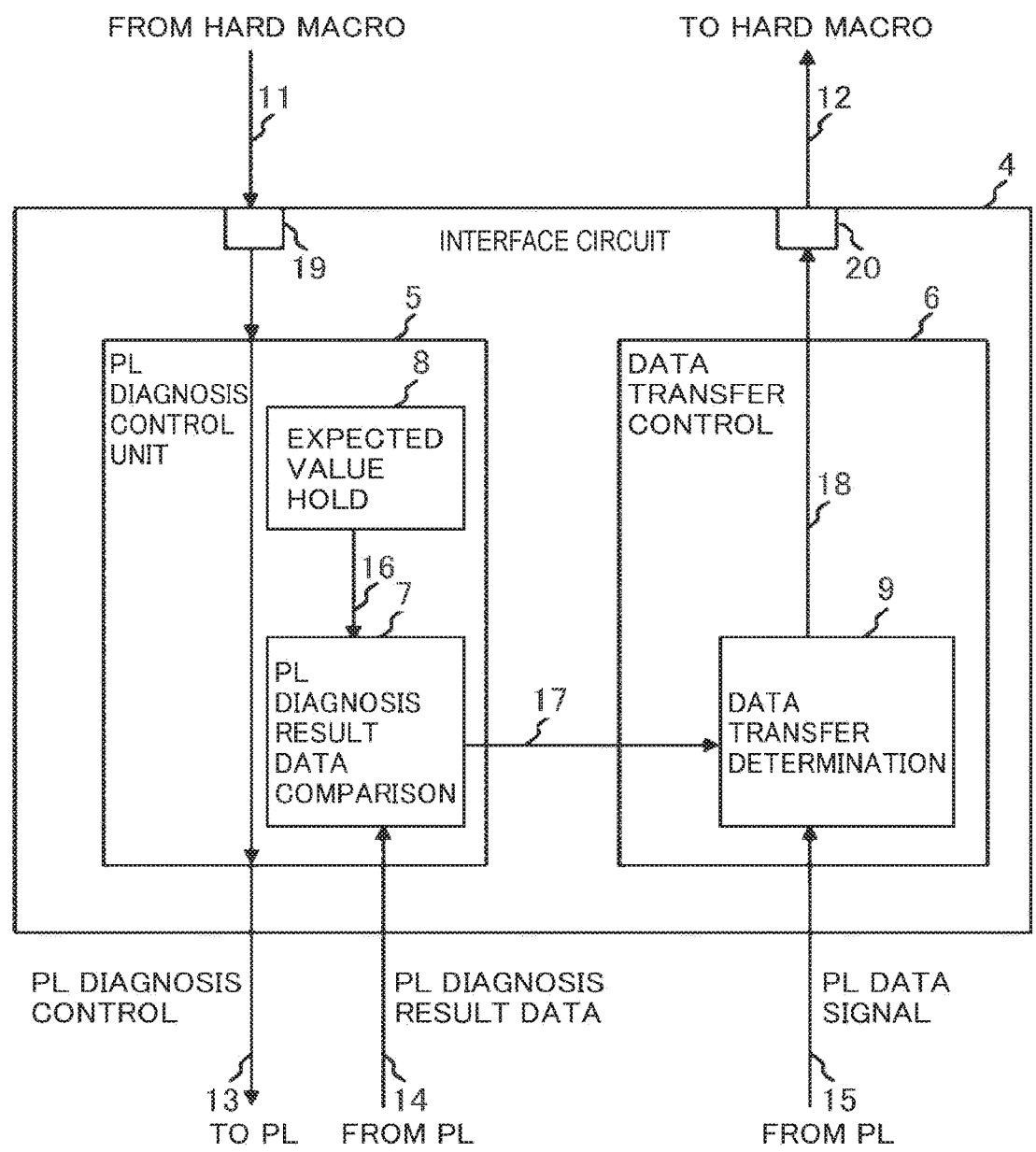
FIG. 2 shows one example of an interface circuit in the field programmable logic array in the first embodiment.

As described above, failure of the PL (3) can be prevented from having an effect on the hard macro by packaging the hard macro 2 and the PL (3) with the area between them and connecting them by only the limited signal lines. FIG. 2 shows one example of the interface circuit 4.

The interface circuit 4 shown in FIG. 2 includes a PL diagnosis control unit 5 and a data transfer control unit 6.

The PL diagnosis control signal 11 output from the hard macro 2 is output to the PL (3) via the PL diagnosis control unit 5 from an input port 19 of the interface circuit 4 as a PL diagnosis control signal 13 and controls PL diagnosis operation for checking whether the PL (3) in failure or not.

In addition, the PL (3) outputs a PL diagnosis result data signal 14 to the interface circuit 4 when PL diagnosis is finished, and the PL diagnosis result data signal is input to PL diagnosis result data comparison equipment 7 in the PL diagnosis control unit 5.

Moreover, expected value hold equipment 8 holds a value of PL diagnosis result data in normal operation without failure in the PL (3) beforehand.

The PL diagnosis result data comparison equipment 7 compares a value of the PL diagnosis result data signal 14 output from the PL (3) and a value of an expected value data signal 16 output from the expected value hold equipment 8, and outputs a specified value as a PL diagnosis result signal 17 depending upon whether the values accord or not. In this case, the PL diagnosis result signal 17 shall be a value of one bit, when the abovementioned values accord, "0" is output, and when they do not accord, "1" is output.

Figure 3:
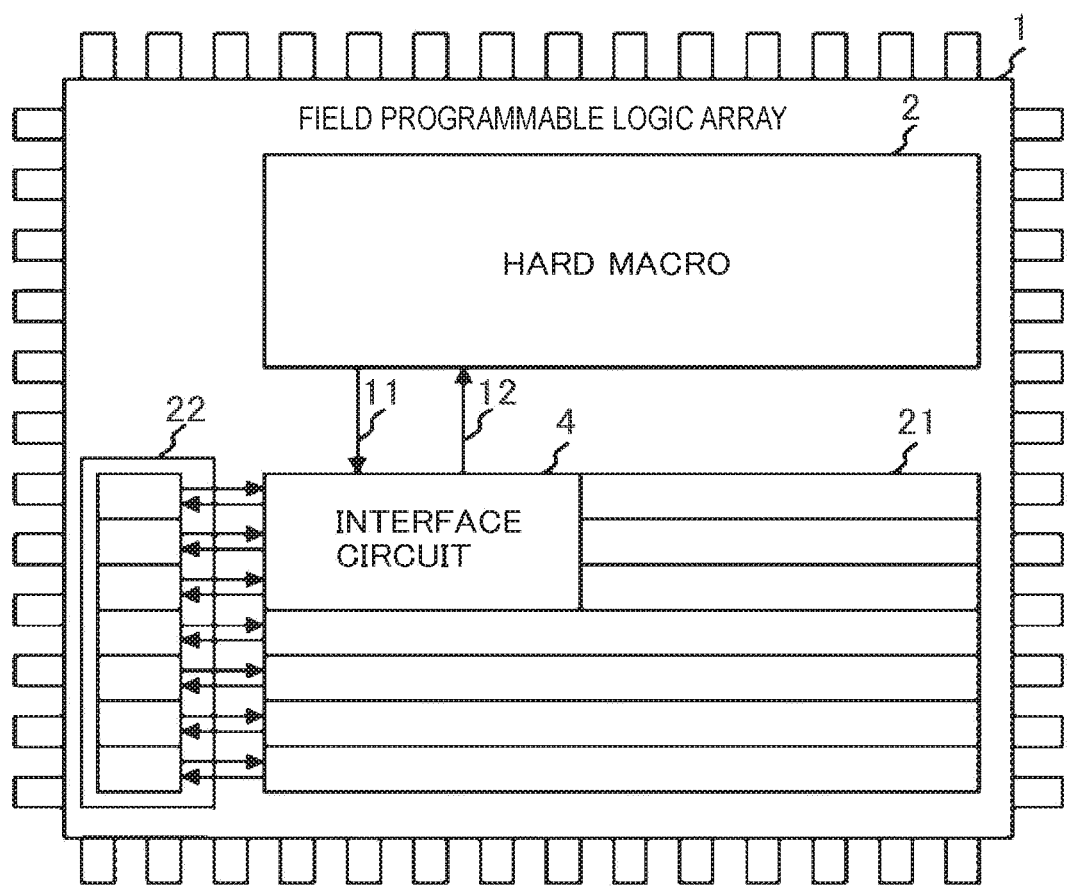
FIG. 3 shows one example of a CRAM diagnostic circuit in the field programmable logic array in the first embodiment.

In the meantime, in the data transfer control unit 6, a PL data signal 15 and the PL diagnosis result signal 17 respectively output from the PL (3) are input to data transfer determination equipment 9 inside the data transfer control unit 6, when a value of the PL diagnosis result signal 17 is "0", no failure and no abnormality occur in the PL (3), a value of the PL data signal 15 is output to the hard macro 2 via an output port 20 as a PL data signal 18 as it is. However, when the value of the PL diagnosis result signal 17 is "1" and failure or abnormality occurs in the PL (3), a value which has no effect on operation of the hard macro 2 is superimposed on the PL data signal 18, and the output port 20 is closed so as to prevent the value of the PL data signal 15 which may have become an incorrect value by the failure of the PL (3) from being transmitted to the hard macro 2. FIG. 3 shows one example of a case where a Configuration Random Access Memory (CRAM) diagnostic circuit shown in FIG. 3 is used for a PL diagnostic function described referring to FIG. 2.

FPGA (1) shown in FIG. 3 is different from the FPGA (1) shown in FIG. 1 in that the CRAM diagnostic circuit 22 is added to PL (21).

The PL (the circuitry part) (21) shown in FIG. 3 is divided into seven lines, the CRAM diagnostic circuit 22 is also divided into seven parts so as to correspond to the seven lines, and diagnosis is made every corresponding line of the PL (21).

The CRAM diagnostic circuit 22 is a circuit for detecting inversion of data held by each line in the PL (21) using algorithm based upon coding theory generally installed in recent SRAM-type FPGA, and the CRAM diagnostic circuit can be readily packaged for a PL diagnostic method in the FPGA according to the present invention.

Since the transmission of the PL data signal 15 to the hard macro 2 can be stopped by this diagnosis even if the PL (3) fails, incorrect data can be consequently prevented from being output to an external device. This embodiment is configured so that an application for which a high level of safety is demanded is executed in the hard macro 2 or after the application is executed in the PL (3), a result of the execution is output to an external device via the hard macro. Since data which is output from the FPGA (1) to an external device and for which a high level of safety is demanded can be an operation result executed in the hard macro 2 or an operation result by the PL (3) the soundness of which is verified owing to such configuration, a high level of safety can be realized using the FPGA (1).

Figure 4:
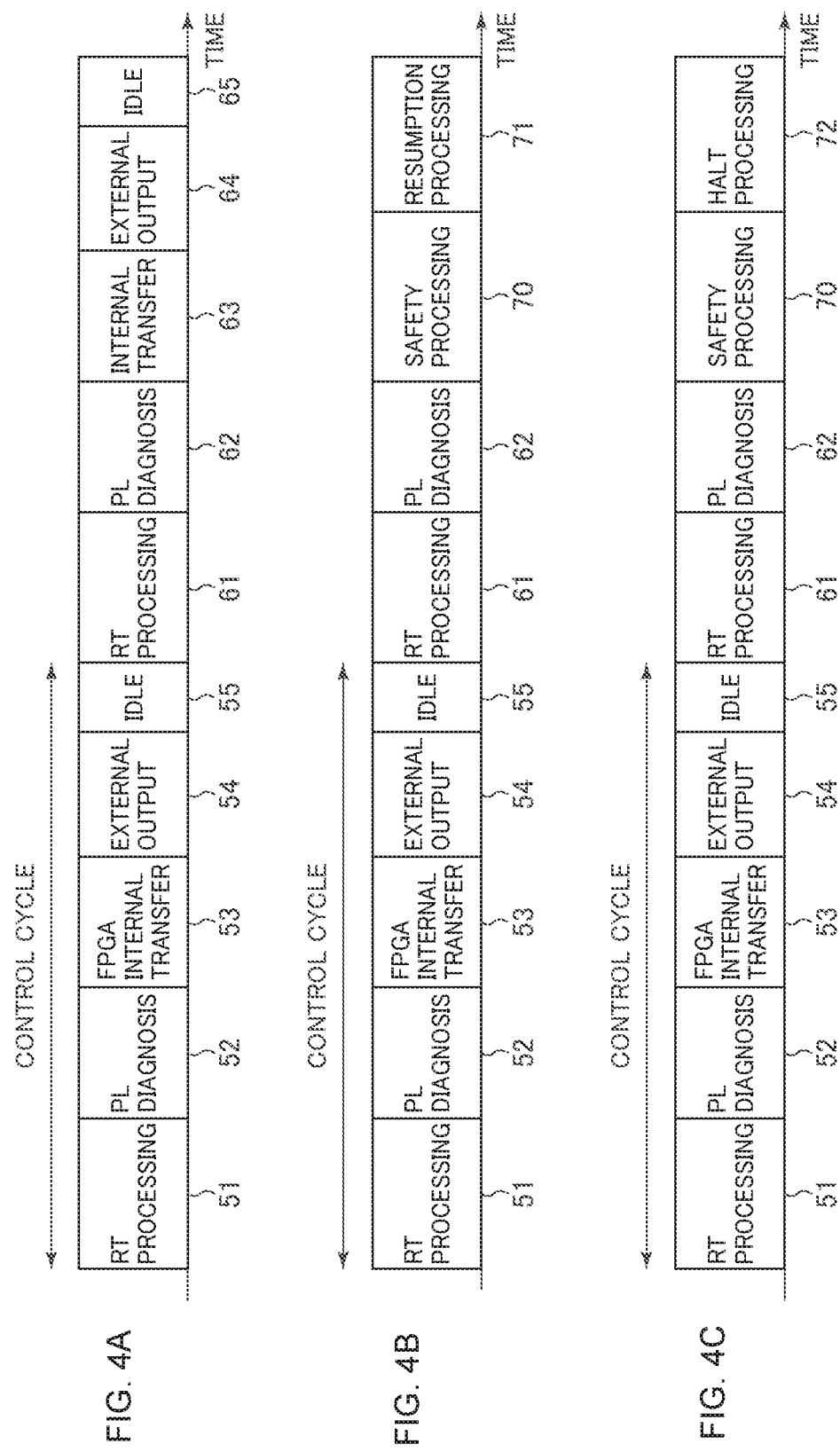
FIGS. 4A-4C show examples of time charts when a system is configured using the field programmable logic array in the first embodiment.

FIG. 4 shows one example of an operational flow when the system for which a high level of safety is demanded is packaged using the FPGA according to the present invention shown in FIGS. 1 to 3.

FIG. 4(a) is a time chart showing one example of such a state that the system is safely operated without failure.

This system is a system repeating, in one control cycle, five of real time (hereinafter called RT) processing 51 in which hardware of the PL part executes real time processing, PL diagnosis processing 52 that makes PL diagnosis by the CRAM diagnostic circuit or others, FPGA internal transfer processing 53 that transfers PL processing data from the PL to the hard macro via the interface circuit, external output processing 54 that outputs a control signal to external equipment connected to the FPGA via the interface circuit during disconnection of data transfer from the PL to the hard macro, and idle time 55 in which the next instruction is awaited without any operation. Both a first cycle and a second cycle in FIG. 4(a) show an example that the operation is normally continued. When the RT processing 51 and the PL diagnosis processing 52 are executed, connection via the interface circuit from the PL to the hard macro is disconnected.

In the meantime, although FIG. 4(b) is the same as the example shown in FIG. 4(a) as to a first cycle, FIG. 4(b) shows an example showing transition to safety processing 70 because it is detected that failure by a soft error has occurred in the PL in PL diagnosis processing 62 in a second cycle, unlike FIG. 4(a), since no internal transfer processing 63 and no external output processing 63 is executed, undesirable data is not transmitted to the outside of the FPGA, the system is resumed in resumption processing 71, and system operation is executed again in a state without influence of the soft error.

In addition, FIG. 4(c) shows an example that the system is halted in a safe state in halt processing 72 after the safety processing 70 differently from FIG. 4(b) such as a case where influence of failure cannot be eliminated even if the system is reactivated by resumption processing of the system due to the failure in the PL part. As described above, since the influence of failure is not output to the outside of the FPGA even if the failure such as a soft error occurs in the PL part configured by SRAM, a mechanism for continuing the operation of the system and safely halting the system in a state in which safety is held can be readily configured.

Second Embodiment

Next, an example of a case where a further high level of safety is realized in a system using the field programmable logic array according to the present invention will be described.

Figure 5:
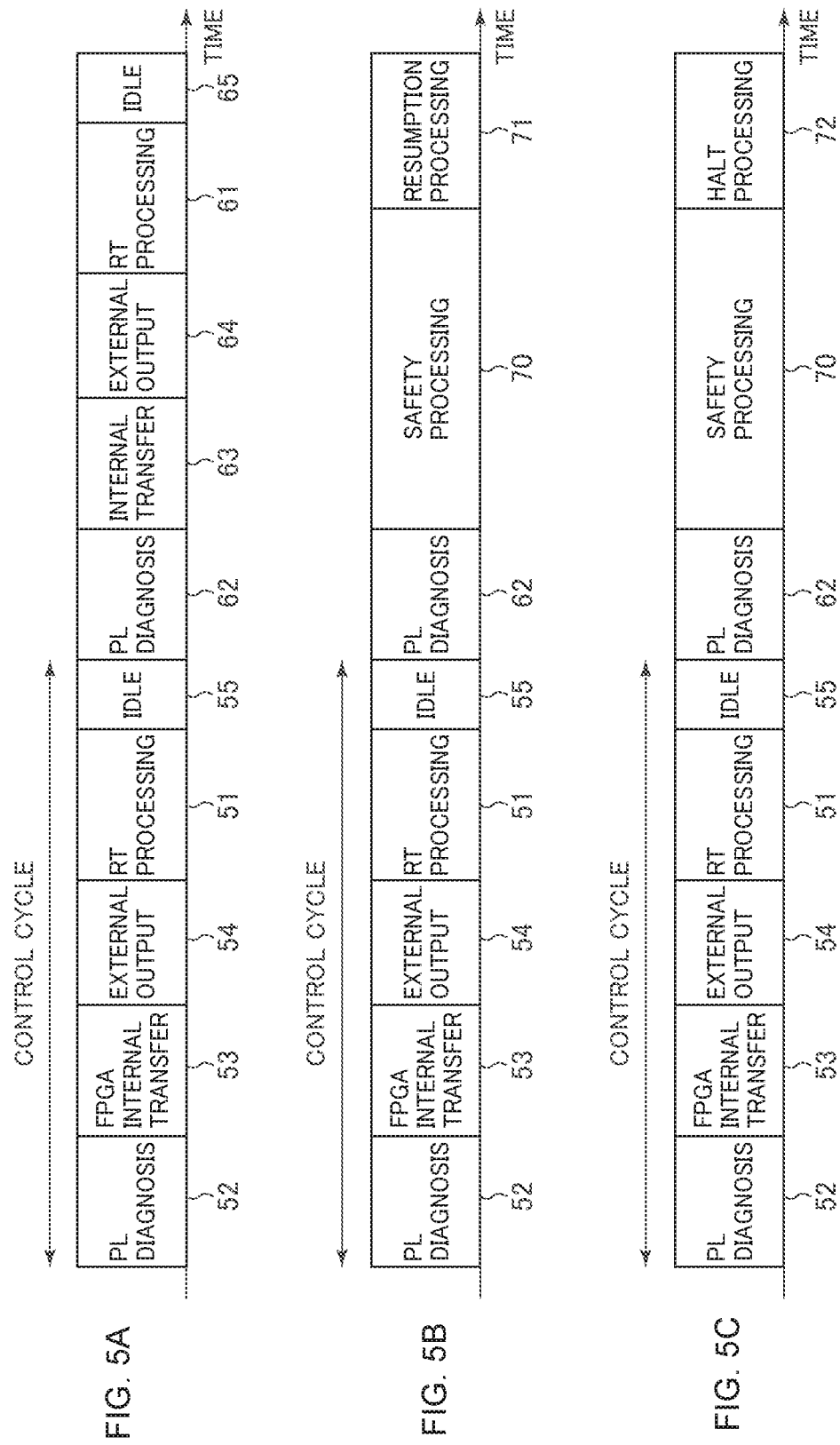
FIGS. 5A-5C show examples of time charts when a system is configured using a field programmable logic array in a second embodiment.

Time charts shown in FIG. 5 are different from the time charts shown in FIG. 4 in that PL diagnosis processing 52 is located at the head of each control cycle in all of (a), (b), (c).

RT processing is executed only when failure of a PL part is not detected by executing the PL diagnosis processing 52 at the beginning of the control cycle.

As described above, a safe operational state can be maintained as the system in units of control cycles by executing the PL diagnosis processing at the beginning of the control cycle.

Third Embodiment

Next, one example of a case where a further higher level of safety is realized without outputting incorrect data to the outside of FPGA in the field programmable logic array according to the present invention will be described referring to FIGS. 6 and 7.

Figure 6:
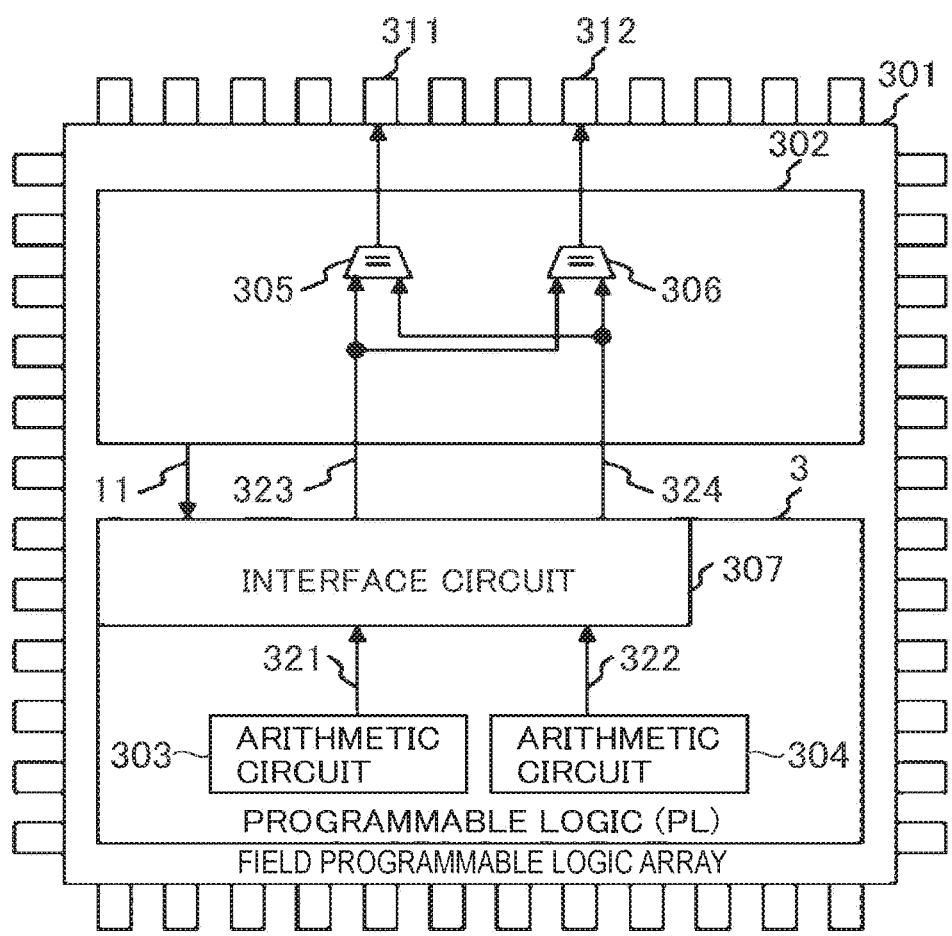
FIG. 6 shows one example of a field programmable logic array in which output from a hard macro is multiplexed in a third embodiment.

The FPGA (301) shown in FIG. 6 is different from the FPGA (1) shown in FIG. 1 in that comparators 305, 306 are installed in a hard macro 302 and in that arithmetic circuits 303, 304 are installed in a part of PL (3).

In this case, the arithmetic circuits 303, 304 have the same function.

Figure 7:
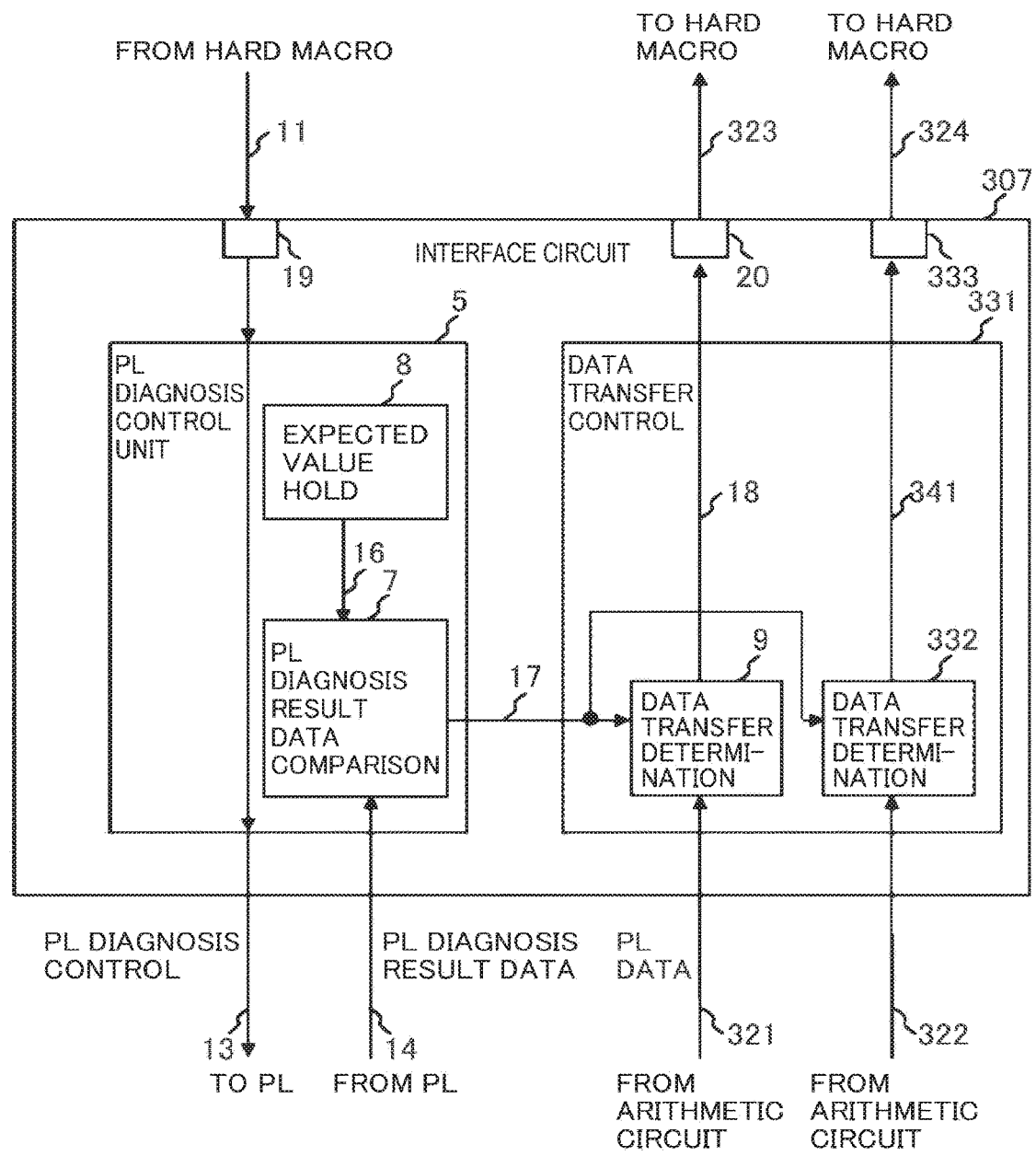
FIG. 7 shows one example of an interface circuit in the field programmable logic array in the third embodiment.

In addition, an interface circuit 307 shown in FIG. 7 is different from the interface circuit 4 shown in FIG. 2 in that another set of data transfer determination equipment 332 and an output port 333 are installed in a data transfer control unit 331.

The data transfer determination equipment 332 inputs a PL data signal 322 from the arithmetic circuit 304 and controls a value of a PL data signal 324 to be output to the hard macro (2) via the port 333 according to a value of a PL diagnosis result signal 17, as in data transfer determination equipment 9.

Since the arithmetic circuits 303, 304 shown in FIG. 6 have the same circuitry configuration, PL data signals 323, 324 output via the interface circuit 307 of the PL (3) have the same value while the PL (3) is normally operated, it is determined in the comparators 305, 306 whether these two signals coincide or not, and only when the signals coincide, the two signals are output to external devices connected to the FPGA from external terminals 311, 312.

As described above, the FPGA that prevents incorrect data from being output to the external devices from the FPGA can be realized by making such a configuration that data before being output to the external terminals of the FPGA is compared and determined.

Fourth Embodiment

Next, an example of a case where a further higher level of safety is realized by providing a communication port to a hard macro in FPGA according to the field programmable logic array according to the present invention will be described.

Figure 8:
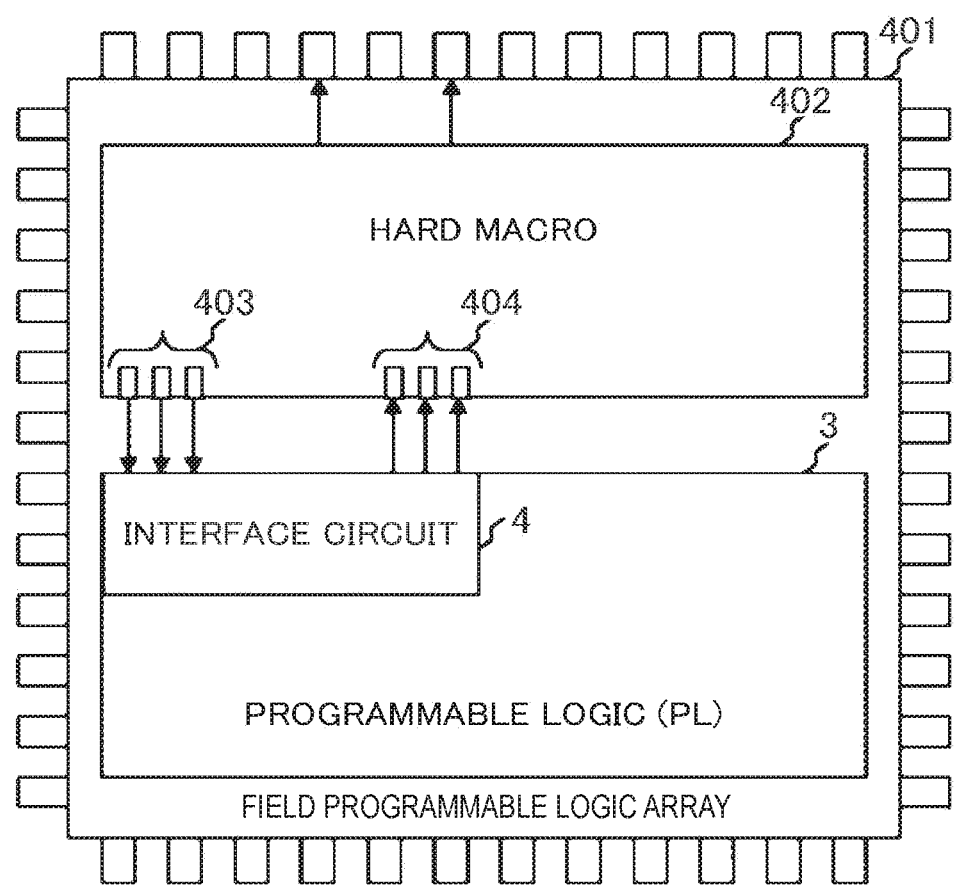
FIG. 8 shows one example of a field programmable logic array provided with dedicated ports in a hard macro in a fourth embodiment.

The FPGA (401) shown in FIG. 8 is different from the FPGA (1) shown in FIG. 1 in that a built-in port 403 operated in outputting and a built-in port 404 operated in inputting are added in the hard macro 402.

Since the built-in port 403 and the built-in port 404 configure a part of the hard macro 2 and circuitry configuration of the hard macro cannot be changed, influence of the following failure can be prevented from being transmitted to the outside of the FPGA via the hard macro 402 by closing the input port 404 which can be controlled only inside the hard macro 2 even if the influence of the failure of PL (3) may be transmitted to the hard macro 2 via an interface circuit 4.

As described above, a possibility that undesirable data is transmitted from the programmable logic susceptible to a soft error to the hard macro is eliminated by providing dedicated built-in ports in the hard macro of the FPGA, and safety as the system can be enhanced by preventing undesirable data from being transmitted to the outside of the FPGA.

Fifth Embodiment

Next, an example that the programmable logic array according to the present invention is packaged in such a state that positions of external terminals directly connected to a hard macro part are fixed will be described.

Figure 9A:
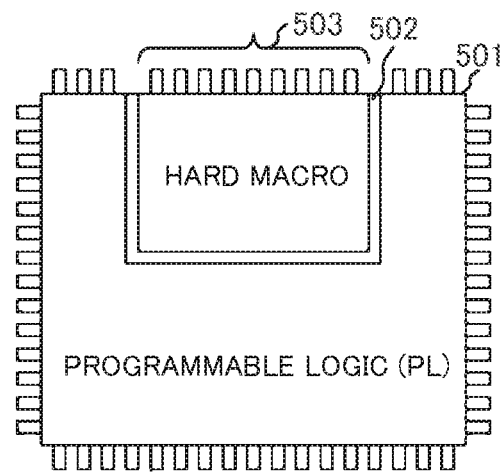
FIGS. 9A and 9B show examples of layout drawings showing external pins connected to a hard macro and external pins connected to programmable logic in a field programmable logic array in a fifth embodiment.

FIG. 9A shows an example of FPGA (501) with the hard macro built in it which is packaged in a Quad Flat Package (QFP) having the external terminals on the periphery of a semiconductor package, and installation areas for the hard macro and programmable logic are separated by a boundary area 502 inside the package.

In the FPGA (501) shown in FIG. 9A, the hard macro part is provided to be adjacent to one side of the semiconductor package, it is connected only to the external terminals 503, and external terminals except for them are connected to the programmable logic part.

Figure 9B:
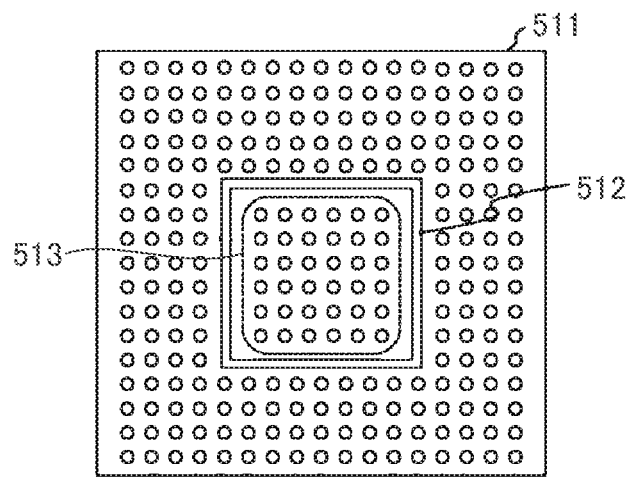

In addition, FIG. 9B shows an example of FPGA (511) with a hard macro built in it which is configured by a Ball Grid Array (BGA) having external terminals at the bottom of a semiconductor package, and installation areas for the hard macro and programmable logic are separated by a boundary area 512 inside the package.

In the FPGA (511) shown in FIG. 9A, the hard macro part is connected only to the external terminals 513 and the external terminals except for them are connected to the programmable logic.

As described above, board packaging when a very safe system is designed using the FPGA is facilitated by the package in which the external terminals connected to the hard macro and the external terminals connected to the programmable logic are separated.

Sixth Embodiment

Next, an example of a case where a hard macro part and a programmable logic part are laminated in the field programmable logic array according to the present invention will be described.

Figure 10:
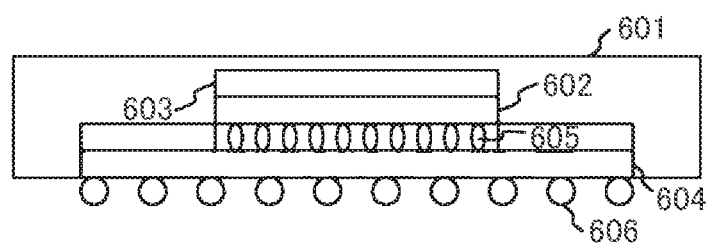
FIG. 10 shows one example of a sectional view when a hard macro and programmable logic in a field programmable logic array in a sixth embodiment are stereoscopically arranged.

FIG. 10 shows one example of a sectional view showing the FPGA according to the present invention configured by BGA, external terminals 606 for connecting to the outside of the FPGA are connected to ball bumps 605 via a metal wiring layer 604, and a hard macro layer 602 is connected to the ball bumps 605.

In this case, a programmable logic layer 603 is laminated on the hard macro layer 602 and physically set off the ball bumps 605.

As described above, the hard macro that executes very safe processing and the programmable logic that executes high-speed parallel processing in which, however, occurrence probability of soft errors is high can be packaged in a small package at a low cost by limiting a circuit connected to the external terminals of the FPGA only to the hard macro part and stereoscopically arranging the programmable logic part and ball bumps separately.

In addition, in FIG. 10, although the example that the package is configured by the BGA is shown, similar lamination and packaging can also be made in a case such as QFP where external terminals are connected on the periphery of a package.

Seventh Embodiment

Next, an example of a case where the field programmable logic array according to the present invention is applied to a controller used for an industrial application system and the like will be described.

Figure 11:
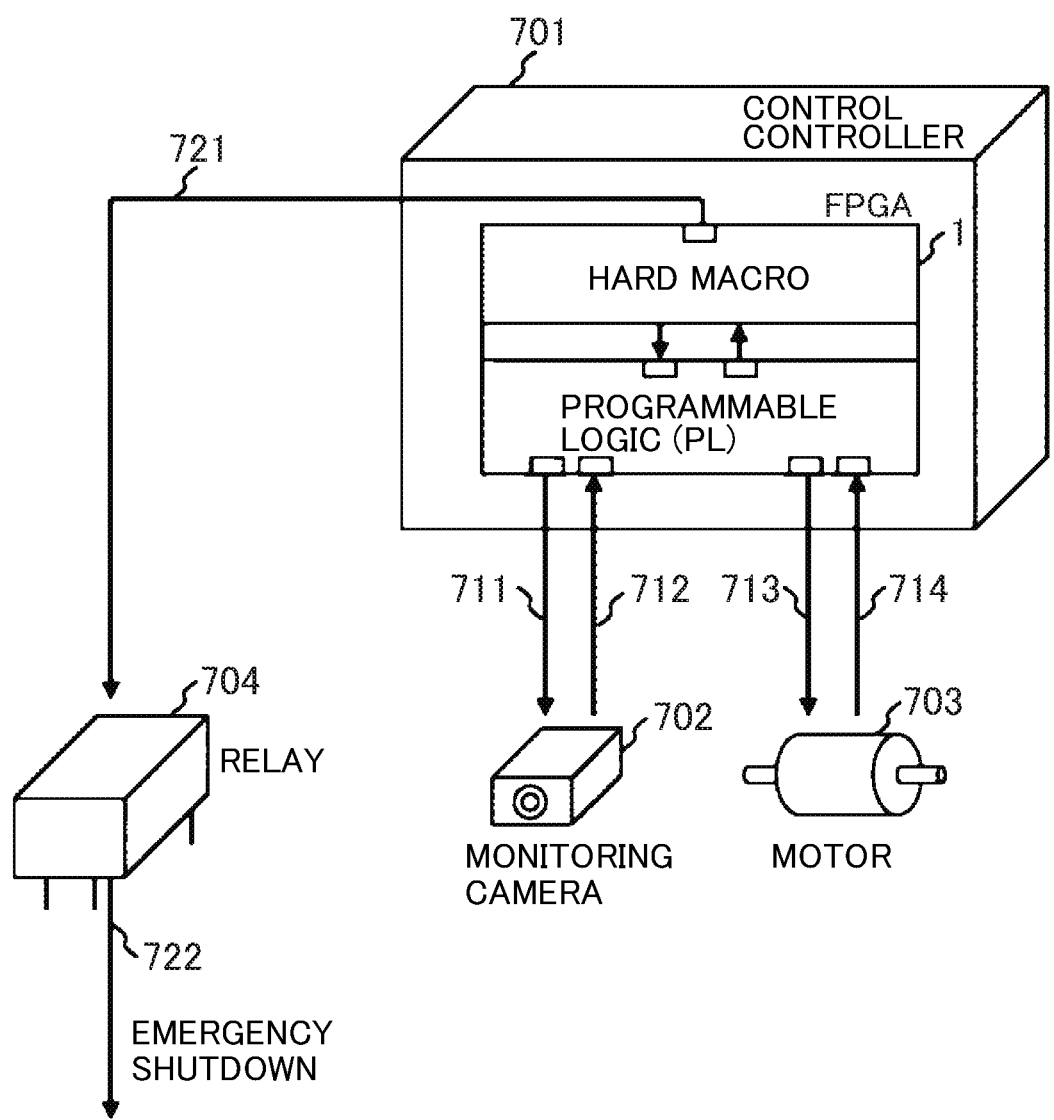
FIG. 11 shows one example of a controller using the field programmable logic array according to the present invention in a seventh embodiment.

FIG. 11 shows an example of a system that controls a power supply system, and the FPGA (1) according to the present invention is mounted as one of parts configuring a control controller 701.

The control controller 701 constantly monitors an operating state of a mechanism for supplying electric power by a monitoring camera 702 and controls power generation by a motor 703 connected to a power unit.

In addition, a relay circuit for safely halting the power system urgently when the system may fall into an abnormal state because of influence of failure and the like is built in a relay 704.

Since it is important to monitor the operating state at real time, an image processing circuit is installed in PL of the FPGA (1), a monitoring camera control signal 711 is output to the monitoring camera 702 from the PL of the FPGA (1), a monitoring camera data signal 712 is output to the PL of the FPGA (1) from the monitoring camera 702, and image processing is performed by hardware of the PL.

Moreover, since it is also important to finely control revolution speed of the motor for operating the mechanism undertaking power supply at real time, a motor control circuit is installed in the PL of the FPGA (1), a motor control signal 713 is output to the motor 703 from the PL of the FPGA (1), a motor data signal 714 is output to the PL of the FPGA (1) from the motor 703, and motor control is made by the hardware of the PL.

In the meantime, the relay 704 manages emergency halt operation in a case where the system fails and the like, and since the relay is securely operated in detecting failure and required to safely halt the system, a high level of safety is demanded for the relay.

Therefore, a relay control signal 721 for controlling the relay 704 is transmitted to the relay 704 from the hard macro part of the FPGA (1) to the relay 704, an emergency halt signal 722 is transmitted in an emergency to a device to be halted from the relay 704, and the system is safely halted.

As described above, the system both provided with a real time property and a high level of safety respectively often demanded in an industrial application system and the like can be readily realized by applying the FPGA according to the present invention.

Eighth Embodiment

Next, an example of a case where the field programmable logic array according to the present invention is applied to a railroad signal control system will be described.

Figure 12:
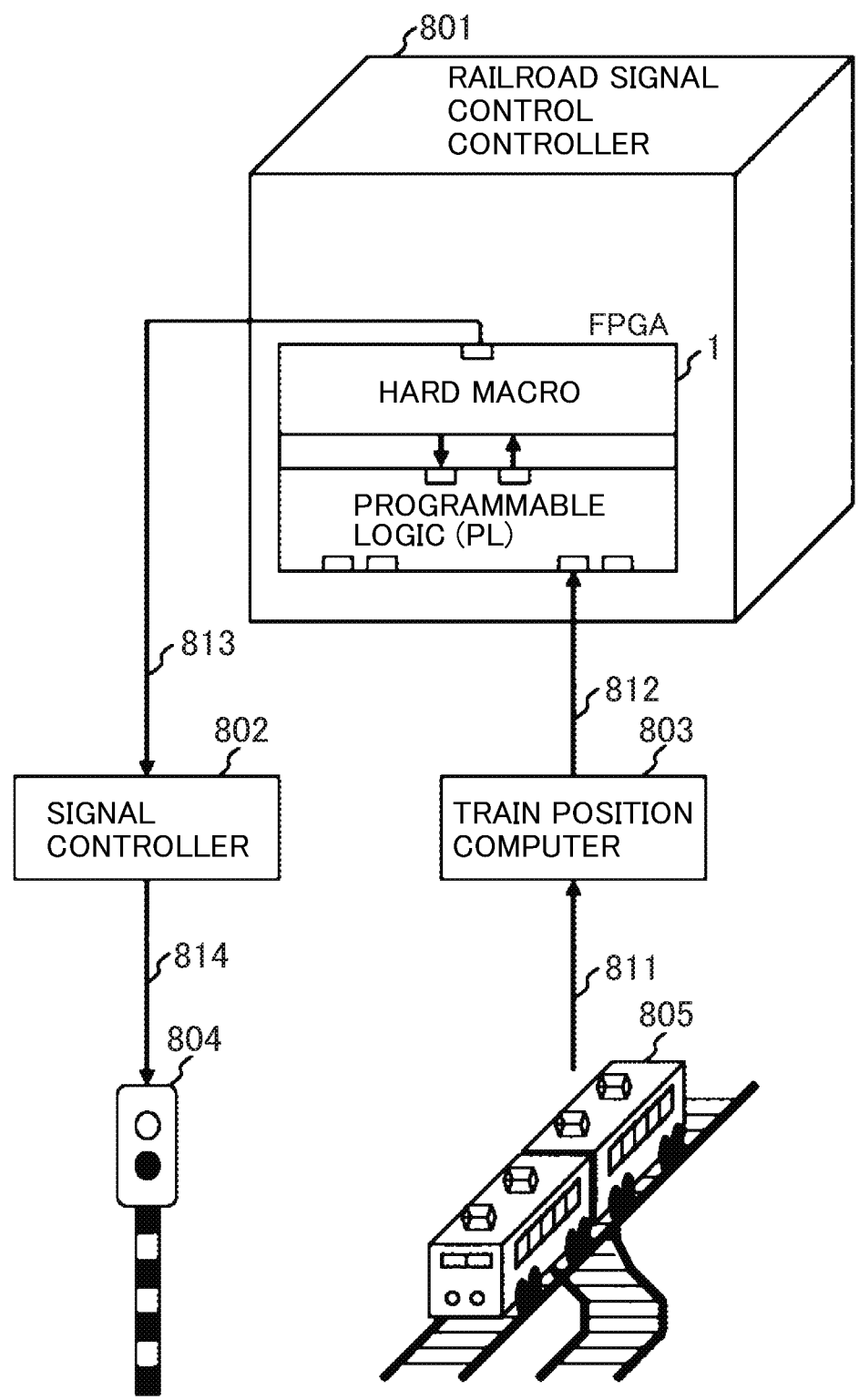
FIG. 12 shows one example of a railroad signal control system using the field programmable logic array according to the present invention in an eighth embodiment.

FIG. 12 shows an example of devices configuring the railroad signal system for controlling progress of trains, and the FPGA (1) according to the present invention is mounted as one of parts configuring a railroad signal control controller 801.

For positional information during running of a rain 805 acquired by sensors attached to rails, train positional information 811 is transmitted to a train position computer 803 via wired or radio communication means, train positional data 812 computed by the train position computer 803 is transmitted to a PL part of the FPGA in the railroad signal control controller 801, and the train positional data is processed by hardware.

In the meantime, a semaphore 804 is a device for notifying a running train to stop in an emergency such as failure and an accident in a railroad system, and since it is necessary in an emergency that the semaphore is securely operated and the train is safely stopped, a high level of safety is demanded for the semaphore.

Therefore, a signal control signal 813 transmitted to a signal controller 802 that controls the semaphore 804 is transmitted from a hard macro part in the FPGA (1) to the signal controller 802, a stop instruction signal 814 is transmitted in an emergency from the signal controller 802 to the semaphore 804, and the train is safely stopped by notifying the train to stop.

As described above, the very safe system can be readily realized by applying the FPGA according to the present invention in the system for railroads for which a very high level of safety is demanded and the like.

Ninth Embodiment

Next, an example of a case where the field programmable logic array according to the present invention is applied to an automobile driving support system will be described.

Figure 13:
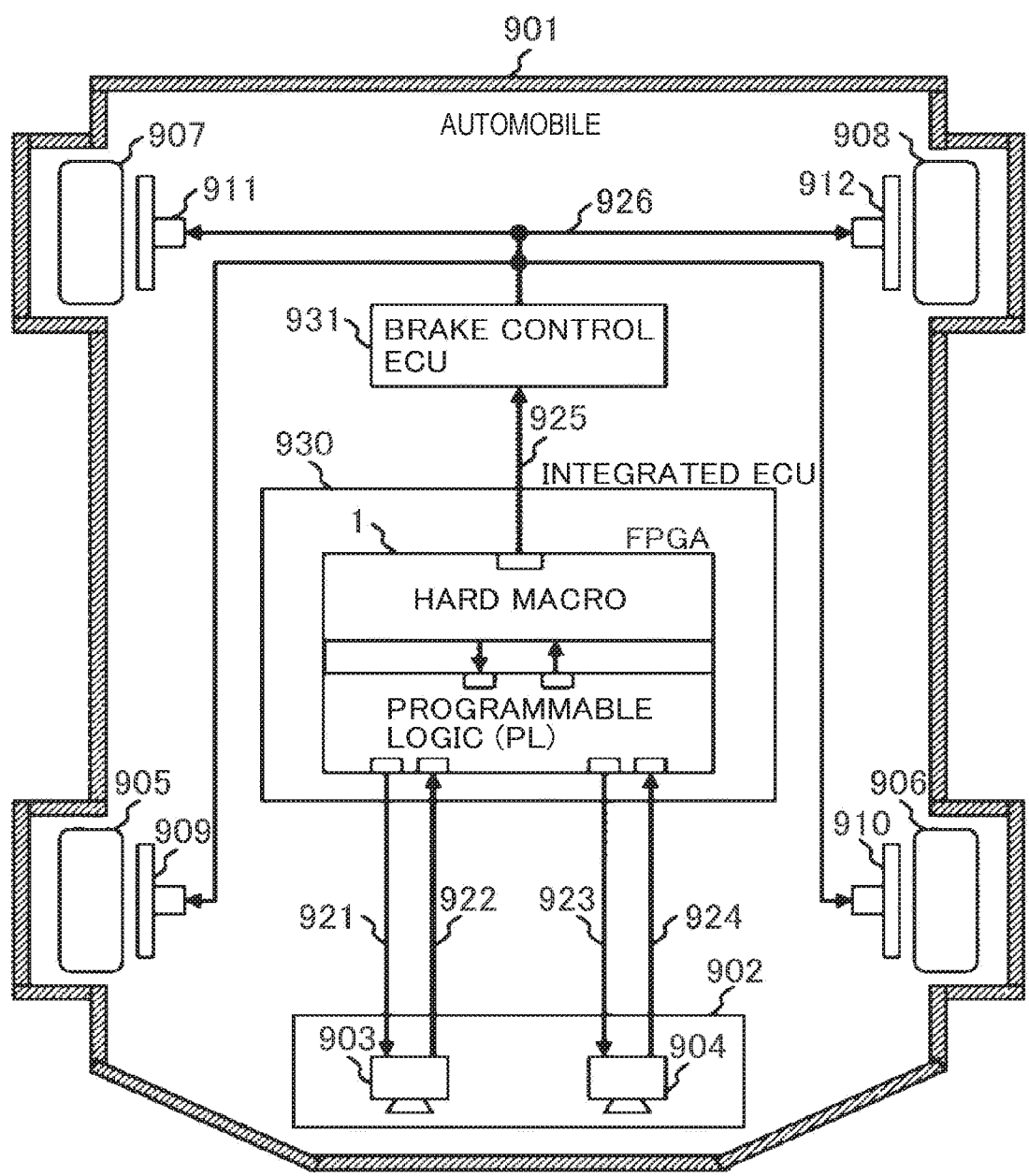
FIG. 13 shows one example of an automobile driving support system using the field programmable logic array according to the present invention in a ninth embodiment.

FIG. 13 shows an example of a configuration of the automobile driving support system using image information during driving for driving control, and the FPGA (1) according to the present invention is mounted as one of parts configuring an integrated ECU (Electric Control Unit) 930 that controls the whole automobile 901.

The automobile 901 is provided with a function for recognizing image information during driving at real time by a stereoscopic camera 902 mounted on the front side of a vehicle body.

The stereoscopic camera 902 is provided with two monocular cameras 903, 904, monocular camera control signals 921, 923 are output to the two monocular camera 903, 904 from PL from the FPGA (1) for control, monocular camera data signals 922, 924 are transmitted to the PL in the FPGA (1) from the monocular cameras 903, 904, and the signals are processed by hardware installed according to image processing algorithm in the PL.

In the meantime, brakes 909, 910, 911, 912 attached to front wheels 905, 906 and rear wheels 907, 908 are required to be securely operated in an emergency such as a case where the system fails inside the automobile 901 and safely stop the automobile 901, and since the automobile may fall into a dangerous state if the automobile cannot be stopped in an emergency, a high level of safety is demanded for the brakes.

Therefore, a brake control signal 925 transmitted to brake control ECU (931) that controls the brakes 909, 910, 911, 912 is transmitted from the hard macro part in the FPGA (1) to the brake control ECU (931), a stop instruction signal 926 is transmitted in an emergency from the brake control ECU (931) to each brake so as to stop the front wheels and the rear wheels, and the automobile is safely stopped.

As described above, one FPGA can readily realize both a system for which a real time property such as image processing is demanded and a system for which a high level of safety of a brake and the like is demanded by applying the FPGA according to the present invention.

The present invention is not limited to the abovementioned embodiments, and various variations are included. For example, the abovementioned embodiments are detailedly described to clarify the present invention, and the present invention is not necessarily limited to the embodiments provided with all the described configurations. In addition, a part of the configuration in the certain embodiment can be replaced with the configuration of another embodiment, and moreover, the configuration of another embodiment can also be added to the configuration of the certain embodiment. Further, a part of the configuration of each embodiment can be added, deleted or replaced to/from/with another configuration.

LIST OF REFERENCE SIGNS

1, 301, 401, 501, 511—Field programmable logic array (FPGA)
2, 302, 402—Hard macro
3, 21—Programmable logic (PL)
4, 307—Interface circuit
5—PL diagnosis control unit
6—Data transfer control unit
7—PL diagnosis data result comparison equipment
8—Expected value hold equipment
9—Data transfer determination equipment
22—CRAM diagnostic circuit
51, 61—RT processing
52, 62—PL diagnosis processing
53, 63—FPGA internal transfer processing
54, 64—External output processing
55, 65—Idle time
70—Safety processing
71—Resumption processing
72—Halt processing
701—Control controller
702—Monitoring camera
703—Motor
704—Relay
801—Railroad signal control controller
802—Signal controller
803—Train position measuring device
804—Semaphore
805—Train
901—Automobile
902—Stereoscopic camera
930—Integrated CEU
931—Brake control ECU

The invention claimed is:

1. A field programmable logic array, comprising:
   a hard macro having a fixed circuitry structure;
   programmable logic arranged via an interval close to the hard macro and having a programmable circuitry structure; and
   an I/F circuit which is provided in the programmable logic and outputs a processing result in the programmable logic to the hard macro,
   wherein the I/F circuit monitors soundness of the programmable logic and stops output of the processing result to be transmitted to the hard macro on the basis of a result of the monitoring;
   wherein the programmable logic: disconnects connection to the hard macro and executes arithmetic processing of a signal to be output to the hard macro;
   is connected to the hard macro after the arithmetic processing is finished and transmits a processing result to the hard macro;
   disconnects the connection to the hard macro after the processing result is transmitted to the hard macro; and
   the hard macro outputs the processing result to the outside of the field programmable logic array while the connection to the programmable logic is disconnected.

2. The field programmable logic array according to claim 1,
   wherein the I/F circuit monitors the soundness of the programmable logic according to a control signal from the hard macro.

3. The field programmable logic array according to claim 2,
   wherein the I/F circuit monitors using a diagnostic result of the programmable logic by using a cyclic redundancy check of a configuration random access memory.

4. The field programmable logic array according to claim 2, wherein the I/F circuit monitors using a diagnostic result of the programmable logic by using an error-correcting code of a configuration random access memory.

5. The field programmable logic array according to claim 1,
wherein a higher level of safety is demanded for an application executed in the hard macro than an application executed in the programmable logic.

6. The field programmable logic array according to claim 1,
wherein a signal output from the programmable logic to the hard macro is multiplexed, and
the hard macro is provided with comparator circuits that compare the multiplexed signals and when the multiplexed signals discord as a result of the comparison, stops output of the signal to the outside of the field programmable logic array.

7. The field programmable logic array according to claim 1,
wherein the hard macro is provided with communication ports which are connected to the I/F circuit and are disconnectable from the I/F circuit.

8. The field programmable logic array according to claim 1,
wherein external terminals of the field programmable logic array are divided into:
external terminals connected only to the hard macro; and
the external terminals connected only to the programmable logic.

9. The field programmable logic array according to claim 8,
wherein the external terminals are installed on four sides of a package, and
the hard macro is provided next to any side of the package.

10. The field programmable logic array according to claim 8,
wherein external terminals are installed at the bottom of a package.

11. The field programmable logic array according to claim 1,
wherein the hard macro is arranged over external pins of the field programmable logic array, and
the programmable logic is arranged further on the hard macro.

* * * * *